(12) United States Patent
Kim

(10) Patent No.: US 8,921,848 B2
(45) Date of Patent: Dec. 30, 2014

(54) ORGANIC LIGHT EMITTING DIODE DISPLAY DEVICE

(71) Applicant: LG Display Co., Ltd., Seoul (KR)

(72) Inventor: Do-Youl Kim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/093,175

(22) Filed: Nov. 29, 2013

(65) Prior Publication Data

US 2014/0183470 A1    Jul. 3, 2014

(30) Foreign Application Priority Data

Dec. 28, 2012 (KR) .................. 10-2012-0156560

(51) Int. Cl.
| H01L 29/08 | (2006.01) |
| H01L 35/24 | (2006.01) |
| H01L 51/00 | (2006.01) |
| H01L 51/52 | (2006.01) |
| H01L 27/32 | (2006.01) |

(52) U.S. Cl.
CPC ........ H01L 51/5253 (2013.01); H01L 27/3276 (2013.01)
USPC ................. 257/40; 257/79; 257/81; 257/100; 257/99

(58) Field of Classification Search
CPC ........................................................ H01L 27/00
USPC ............................................. 257/40, 79–100
See application file for complete search history.

(56) References Cited

U.S. PATENT DOCUMENTS

| 8,653,511 B2 * | 2/2014 | Shin ............................... 257/40 |
| 2011/0303922 A1 * | 12/2011 | Cho et al. ......................... 257/71 |
| 2012/0097927 A1 * | 4/2012 | Shin ............................... 257/40 |
| 2014/0159003 A1 * | 6/2014 | Shin ............................... 257/40 |
| 2014/0184937 A1 * | 7/2014 | Lim et al. ........................ 349/12 |

* cited by examiner

*Primary Examiner* — Telly Green
(74) *Attorney, Agent, or Firm* — Birch, Stewart, Kolasch & Birch, LLP

(57) ABSTRACT

An organic light emitting diode (OLED) display device including a base substrate having a display area and a non-display area; OLEDs formed in corresponding sub-pixel regions defined by a bank insulating film in the display area of the base substrate; a pad part formed in the non-display area of the base substrate and configured to apply a driving signal to the OLEDs; a plurality of passivation films formed in the display area to cover the OLEDs, the plurality of passivation films including a first inorganic film, an organic film, and a second inorganic film, the plurality of passivation films being sequentially stacked. A region of an edge of the organic film that corresponds to a wire through which the driving signal is applied to the OLEDs from the pad part includes at least one groove formed at an inside area of the organic film.

16 Claims, 6 Drawing Sheets

--Related Art--

--Related Art--

ORGANIC LIGHT EMITTING DIODE DISPLAY DEVICE

This application claims the benefit of Korean Patent Application No. 10-2012-0156560, filed on Dec. 28, 2012, which is hereby incorporated by reference as if fully set forth herein.

BACKGROUND OF THE INVENTION

1. Field of the Invention

The present invention relates to an organic light emitting diode display device with enhanced reliability.

2. Discussion of the Related Art

Image display devices, which display a variety of information on a screen, are based on core information and communication technology and they are becoming increasingly thinner, lighter, more portable, and higher in performance. Thus, organic light emitting diode (OLED) display devices, which display an image by controlling light emission of an organic emission layer (EML), are flat panel display devices that may be designed to have lower weight and volume than with cathode ray tubes (CRTs).

Such OLED display devices include OLEDs, which are self-emissive devices using the EML, which can be a thin emission layer, between electrodes. An OLED may include a first electrode that is an anode connected to a thin film transistor (TFT) formed in each of sub-pixel regions of a substrate, the EML, and a second electrode that is a cathode.

In such OLEDs, when voltage is applied between the first electrode and the second electrode, holes and electrons are recombined in the EML, forming excitons, and the excitons drop to a ground state, whereby light is emitted. In addition, a passivation film is formed on OLEDs so as to cover the OLEDs and thus prevent permeation of moisture and oxygen into the OLEDs.

FIG. 1A is a plan view of an OLED display device according to related art.

As illustrated in FIG. 1A, the OLED display device according to related art includes a plurality of OLEDs formed in a display area of a substrate 10 and a pad part 20 formed in a non-display area of the substrate 10. In addition, the OLEDs are connected to the pad part 20 via wires 10a, and driving signals from the pad part 20 are applied to the OLEDs via the wires 10a.

Such OLEDs are susceptible to moisture and oxygen and thus a passivation film is formed so as to cover the OLEDs. In this regard, the passivation film includes an organic film 13 to compensate for step differences due to foreign materials which permeate the display area. The organic film 13 is generally formed by coating and curing an organic insulating material. However, when coating the organic insulating material, the organic insulating material flows outside the display area along the wires 10a.

FIG. 1B is an image showing defects of the OLED display device according to related art.

As illustrated in FIG. 1B, when the organic film 13 extends up to the outside of the display area of the OLED display device, external moisture and oxygen permeate into the OLEDs via the organic film 13. The moisture and oxygen permeating into the OLEDs react with organic EMLs of the OLEDs generating defects such as dark spots, whereby reliability of the OLED display device is deteriorated.

SUMMARY OF THE INVENTION

Accordingly, the present invention is directed to an organic light emitting diode display device that substantially obviates one or more problems due to limitations and disadvantages of the related art.

An object of the present invention is to provide an organic light emitting diode display device with improved reliability by forming a groove at an edge of an organic film formed to cover organic light emitting diodes.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a base substrate having a display area and a non-display area; OLEDs formed in corresponding sub-pixel regions defined by a bank insulating film in the display area of the base substrate; a pad part formed in the non-display area of the base substrate and configured to apply a driving signal to the OLEDs; a plurality of passivation films formed in the display area to cover the OLEDs, the plurality of passivation films including a first inorganic film, an organic film, and a second inorganic film, the plurality of passivation films being sequentially stacked; and an encapsulation substrate formed above the base substrate and the plurality of passivation films, the encapsulation substrate being adhered to the second inorganic film and the base substrate via an adhesive layer. A region of an edge of the organic film that corresponds to a wire through which the driving signal is applied to the OLEDs from the pad part includes at least one groove formed at an inside area of the organic film.

The at least one groove has a shape selected from among a circle and an oval.

The at least one groove has a shape selected from among a polygon, a square, and a triangle An edge of the bank insulating film is disposed within the edge of the organic film.

An outermost portion of the edge of the organic film in which the at least one groove is formed has a distance of approximately 1 μm to 500 μm from the edge of the bank insulating film.

The second insulating film may be formed so as to completely cover the edge of the organic film.

The organic film may have a thickness of 1 μm to 20 μm.

The first inorganic film is formed directly above the OLEDs, the organic film including the at least one groove is formed directly above the organic film, and the second inorganic film is formed directly above the organic film. The at least one groove has a shape selected from among a circle, an oval, a polygon, a square, and a triangle.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts. Further, any one or more features and/or elements from one or more embodiments of the present invention described herein can be applied or combined to any one or more embodiments of the present invention described herein. Further, one or more elements from one or more embodiments of the present invention can substitute one or more elements in another embodiment of the present invention.

Hereinafter, an organic light emitting diode (OLED) display device according to an embodiment of the present invention will be described in detail with reference to the accompanying drawings.

Figure 2:
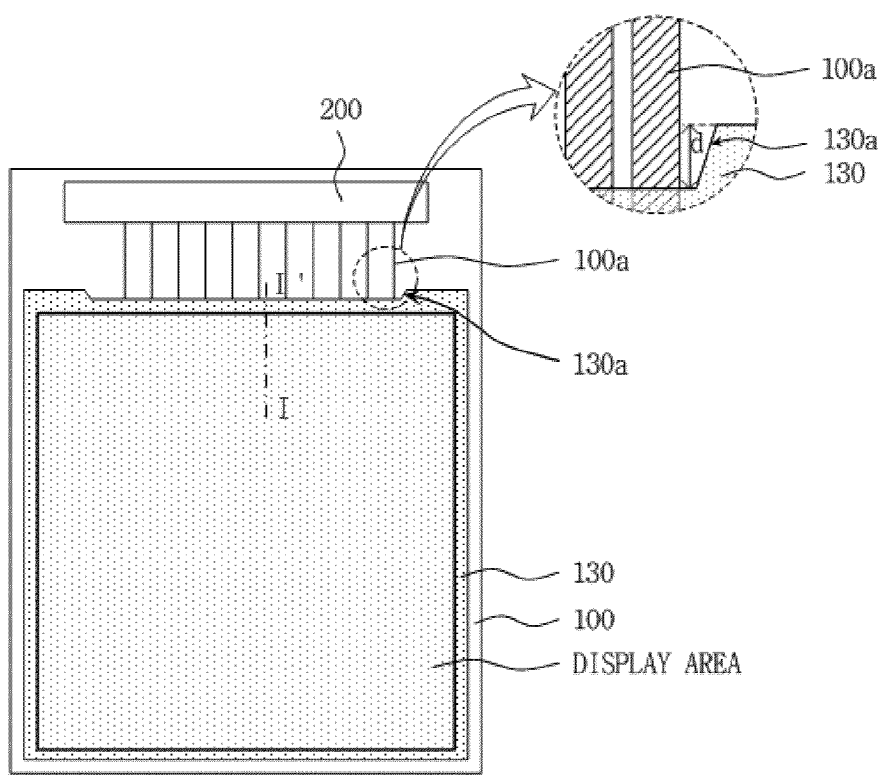
FIG. 2 is a plan view of an OLED display device according to an embodiment of the present invention.
Figure 3:
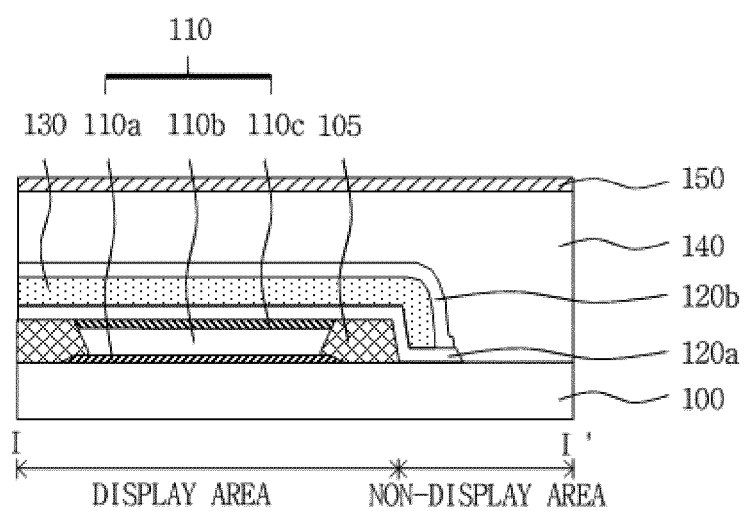
FIG. 3 is a sectional view taken along line I-I' of FIG. 2.

FIG. 2 is a plan view of an OLED display device according to an embodiment of the present invention. FIG. 3 is a sectional view taken along line I-I' of FIG. 2.

As illustrated in FIGS. 2 and 3, the OLED display device includes an OLED 110 formed in a display area of a substrate 100, a pad part 200 formed in a non-display area of the substrate 100 and connected to the OLED 110 via wires 100a to apply driving signals to the OLED 110. The OLED display device also includes a first inorganic film 120a, an organic film 130, a second inorganic film 120b, and an encapsulation substrate 150. The first inorganic film 120a, the organic film 130, and the second inorganic film 120b are sequentially formed so as to cover the OLED 110. The encapsulation substrate 150 is adhered, via an adhesive layer 140, to the OLED 110 opposite the substrate 100.

A region of the organic film 130 that corresponds to the wires 100a through which a driving signal is applied to the OLED 110 from the pad part 200 includes at least one groove 130a formed at the inside edge of the region of the organic film 130.

The at least one groove 130a may include, for example, a plurality of grooves corresponding to the respective wires 100a, or, as illustrated in the drawings, a single groove corresponding to the wires 100a.

In particular, the OLED display device according to the present invention may include, for example, a plurality of gate lines and a plurality of data lines intersecting each other on the substrate 100. The OLED display device may include, for example, a plurality of sub-pixel regions in the form of a matrix being defined by the intersections therebetween. In addition, a thin film transistor and the OLED 110 connected to the thin film transistor are formed in each sub-pixel region. The OLEDs 110 formed in the respective sub-pixel regions are spaced apart from one another by a bank insulating film 105.

The first electrode 110a, the organic emission layer (EML) 110b, and the second electrode 110c included in the OLED 110 are sequentially stacked. The first electrode 110a may be an anode connected to a drain electrode of the thin film transistor. The first electrode 110a may be formed of a transparent conductive material such as, for example, tin oxide (TO), indium tin oxide (ITO), indium zinc oxide (IZO), and indium tin zinc oxide (ITZO).

In addition, the bank insulating film 105 may include, for example, bank holes exposing portions of the first electrodes 110a formed on a front surface of the display area of the substrate 100. As described above, the bank insulating film 105 may separate adjacent OLEDs 110 from each other and defines light emitting regions of the display area.

The organic EML 110b and the second electrode 110c are sequentially formed on the first electrode 110a, which is exposed by the bank insulating film 105. As illustrated in FIG. 3, the organic EML 110b may be formed only on the first electrode 110a. In addition, the organic EML 110b may be formed on the bank insulating film 105.

The organic EML 110b may be formed of red (R), green (G), blue (B) and white (W) light-emitting materials. In addition, the organic EML 110b may be formed of only a white light-emitting material in each sub-pixel region. When the organic EML 110b is formed of only the white light-emitting material, R, G and B color filters may be formed in each sub-pixel region and thus light of a variety of colors may be realized while white light emitted from the organic EML 110b passes through the color filters.

The second electrode 110c, which is formed on the organic EML 110b, may be formed of a reflective metal material or transparent conductive material. For example, when the second electrode 110c is formed as a cathode using the reflective metal material such as, for example, aluminum (Al), light emitted from the organic EML 110b may be reflected to the first electrode 110a. On the other hand, when the second electrode 110c is formed of the transparent conductive material, the first electrode 110a may be formed of a reflective metal and light emitted from the organic EML 110b may be reflected to the second electrode 110c.

In the above-described OLED 110, when voltage is applied between the first and second electrodes 110a and 110c, holes and electrons are recombined in the organic EML 110b, forming excitons and the excitons drop to a ground state, thereby emitting light. A hole injection layer (HIL) and a hole transport layer (HTL), for example, may be further formed between the first electrode 110a and the organic EML 110b. The HIL and the HTL may be formed to satisfactorily inject holes into the organic EML 110b. In addition, an electron injection layer (EIL) and an electron transport layer (ETL) may be further formed between the organic EML 110b and the second electrode 110c. The EIL and the ETL may be formed to satisfactorily inject electrons into the organic EML 110b.

Because the OLED 110 is very susceptible to moisture and oxygen, a passivation film may be formed to cover the OLED 110 to prevent external moisture and oxygen from permeating into the OLED 110. In this regard, the passivation film may be formed of inorganic insulating materials such as $SiO_x$, $SiN_x$, SiC, SiON, SiOC, SiONC, and amorphous carbon (a-C), or the like and an organic insulating material such as acrylate, an epoxy-based polymer, an imide-based polymer, or the like.

FIGS. 2 and 3 illustrate the OLED display device including, as passivation films, first and second inorganic films 120a and 120b that are sequentially stacked and the organic film 130 formed between the first and second inorganic films 120a and 120b. The first and second inorganic films 120a and 120b formed of any of the above-described inorganic insulating materials prevent external moisture and oxygen from permeating into the OLED 110. In addition, the organic film 130 formed of any of the above-described organic insulating materials compensates for step differences due to foreign materials included in the first and second inorganic films 120a and 120b and also increases the length of a path through which moisture and oxygen permeate into the display area. In this regard, to sufficiently compensate for the step differences due to foreign materials, the organic film 130 may have a thickness from 1 to 20 μm.

In particular, the first inorganic film 120a is formed so as to cover the OLED 110, and the organic film 130 is formed on the first inorganic film 120a. In general, the organic film 130 is formed by coating an organic insulating material via screen-printing, slit coating, spin coating, inkjet-printing, or the like and curing the organic insulating material using ultraviolet (UV) light or heat.

Figure 1A:
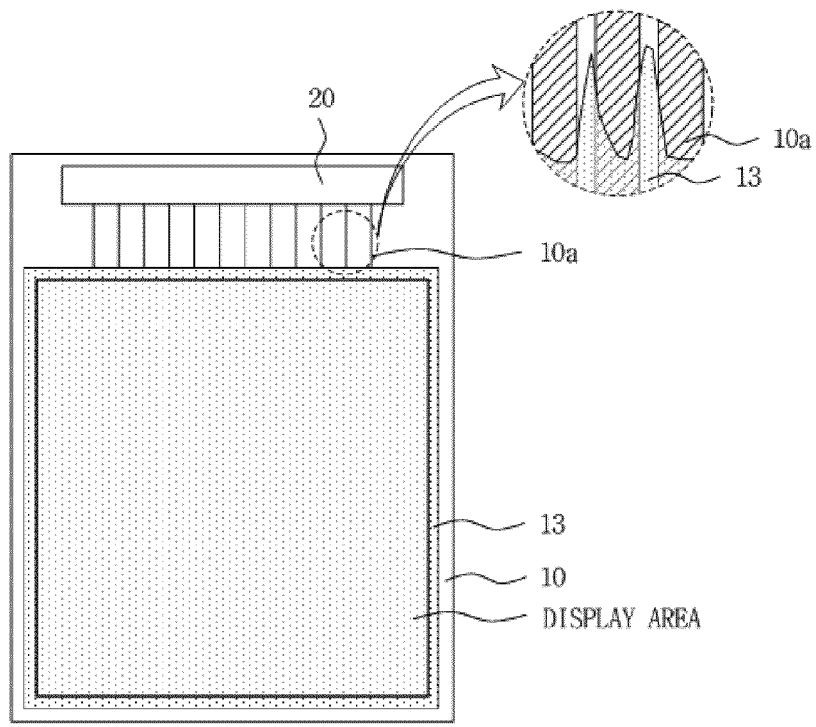
FIG. 1A is a plan view of an organic light emitting diode (OLED) display device according to related art.
Figure 1B:
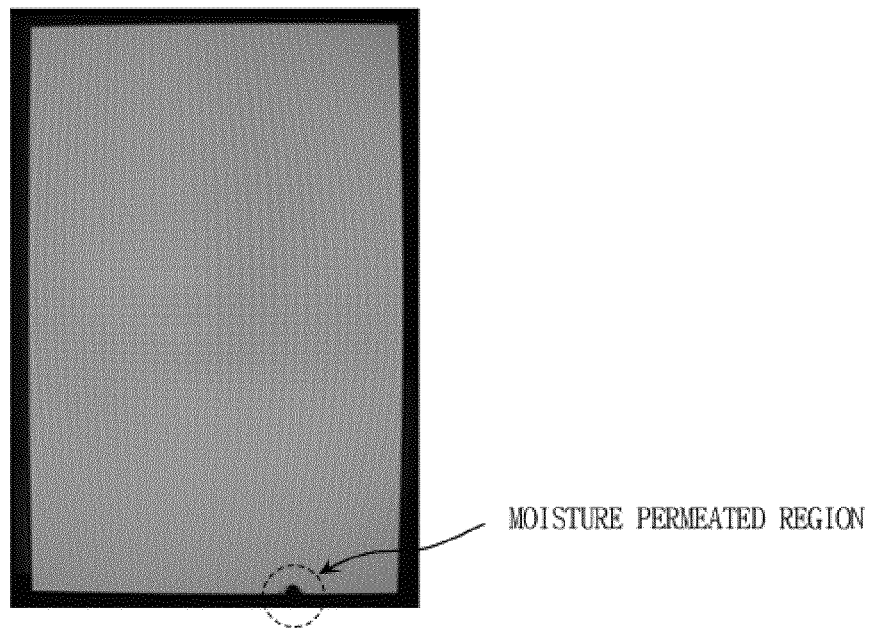
FIG. 1B is an image showing defects of the OLED display device according to related art.

However, in OLED display devices in related art (refer to FIG. 1A), before curing the organic insulating material that has a relatively low viscosity, the organic insulating material with the relatively low viscosity flows outside the display area along the wires 10a. To address the above-described problems in the OLED display devices in related art, the OLED display device according to the embodiments of the present invention includes a groove 130a in an inside edge of the organic film 130 corresponding to the wires 100a. Thus, even though the organic insulating material coated on the first inorganic film 120a flows along the wires 100a before the curing process, the organic insulating material fills the groove 130a and does not flow outside the display area. Thus, the second inorganic film 120b formed on the organic film 130 may completely cover the edge of the organic film 130.

The size of the groove 130a may be comparatively measured according to a width d of the groove 130a. When the width d of the groove 130a is large, the display area decreases and the non-display area increases, which results in a reduced aperture ratio. Thus, a distance between the outermost portion of the edge of the organic film 130 at which the groove 130a is formed and the innermost portion of the groove 130a, i.e., the width d of the groove 130a, may be 500 μm or less.

In addition, the edge of the organic film 130 may extend beyond the edge of the bank insulating film 105 to prevent foreign materials from directly permeating into the bank insulating film 105 during manufacture. In particular, the outermost portion of an edge of one of four edges of the organic film 130 that has the groove 130a formed thereat may have a distance of 1 μm to 500 μm from the edge of the bank insulating film 105 to sufficiently cover the edges of the bank insulating film 105.

As described above, the organic film 130 of the OLED display device according to the present invention includes the groove 130a formed at the inside of the organic film 130 in the region corresponding to the wires 100a through which driving signals are applied to the OLED 110 from the pad part 200. Thus, even though the organic insulating material coated for formation of the organic film 130 flows along the wires 100a, the organic insulating material fills the groove 130a.

Accordingly, the organic film 130 does not extend beyond the display area. In addition, the second inorganic film 120b formed on the organic film 130 completely covers the edge of the organic film 130, whereby reliability of the OLED display device may be enhanced. Although FIGS. 2 and 3 illustrate the groove 130a as having a trapezoidal shape, the groove 130a may have various shapes.

Figure 4A:
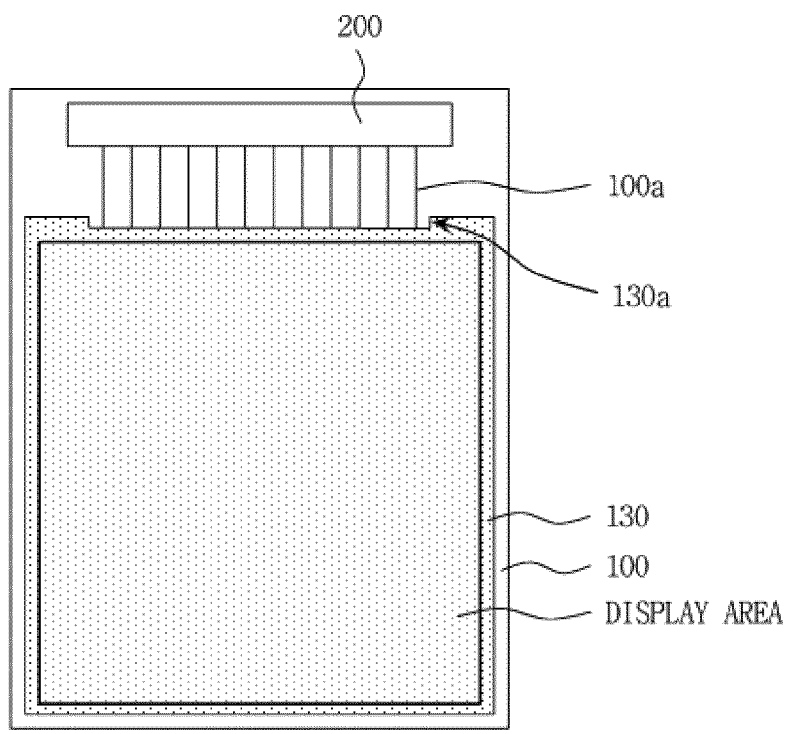
FIGS. 4A and 4B are plan views illustrating examples of the shape of a groove illustrated in FIG. 2.
Figure 4B:
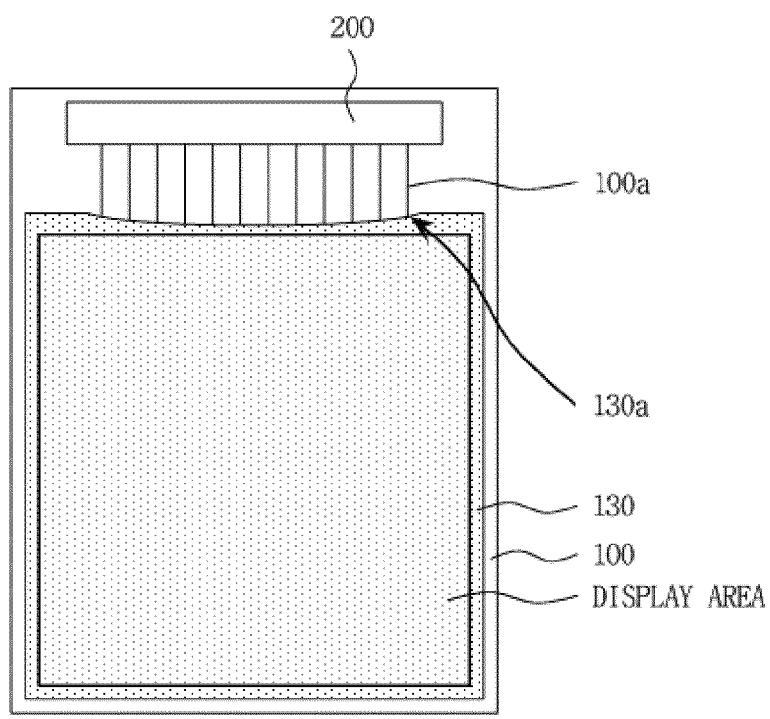

FIGS. 4A and 4B are plan views illustrating examples of the shape of the groove 130a illustrated in FIG. 2.

As illustrated in FIG. 4A, the groove 130a may have a rectangular shape or a polygonal shape such as a square, a triangle, or the like. In addition, as illustrated in FIG. 4B, the groove 130a may have an oval shape, a circular shape, or any curved shape.

The encapsulation substrate 150 formed of glass or plastic is attached to a front surface of the passivation films, i.e., the first and second inorganic films 120a and 120b and the organic film 130, through the adhesive layer 140 (refer to FIG. 3). The encapsulation substrate 150 protects the OLED 110 from external moisture, oxygen, or the like, and the adhesive layer 140 may be formed of an acryl resin, a silicon resin, or a sealant.

As described above, in the OLED display device according to the embodiments of the present invention, a region of the edge of the organic film 130 that corresponds to the wires 100a through which driving signals are applied from the pad part 200 includes at least one groove so that the second inorganic film 120b completely covers the edge of the organic film 130 formed on the OLED 110. Accordingly, the organic insulating material for forming the organic film 130 does not flow outside the display area, and the second inorganic film 120b formed on the organic film 130 completely covers the edge of the organic film 130 with the groove 130a formed thereat. Thus, permeation of external moisture and oxygen into the OLED 110 via the organic film 130 may be prevented and reliability of the OLED display device may be enhanced.

As is apparent from the foregoing description, the OLED display device according to the embodiments of the present invention includes an organic film formed to cover OLEDs, the organic film including an edge with a groove. The OLED display device including the edge with the groove prevents the flow of an organic insulating material coated to form the organic film outside a display area of the OLED display device. In addition, an inorganic film formed on the organic film completely covers the edge of the organic film at which the groove is formed to prevent permeation of external moisture and oxygen into the OLED via the organic film. Accordingly, reliability of the OLED display device may be enhanced.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting diode (OLED) display device comprising:
    a base substrate having a display area and a non-display area;
    OLEDs formed in corresponding sub-pixel regions defined by a bank insulating film in the display area of the base substrate;
    a pad part formed in the non-display area of the base substrate and configured to apply a driving signal to the OLEDs;
    a plurality of passivation films formed in the display area to cover the OLEDs,
    the plurality of passivation films including a first inorganic film, an organic film, and a second inorganic film, the plurality of passivation films being sequentially stacked; and
    an encapsulation substrate formed above the base substrate and the plurality of passivation films, the encapsulation substrate being adhered to the second inorganic film and the base substrate via an adhesive layer,
    wherein a region of an edge of the organic film that corresponds to a wire through which the driving signal is applied to the OLEDs from the pad part includes at least one groove formed at an inside area of the organic film.

2. The OLED display device according to claim 1, wherein the at least one groove has a shape selected from among a circle and an oval.

3. The OLED display device according to claim 1, wherein the at least one groove has a shape selected from among a polygon, a square, and a triangle.

4. The OLED display device according to claim 1, wherein an edge of the bank insulating film is disposed within the edge of the organic film.

5. The OLED display device according to claim 4, wherein an outermost portion of the edge of the organic film in which the at least one groove is formed has a distance of approximately 1 μm to 500 μm from the edge of the bank insulating film.

6. The OLED display device according to claim 1, wherein the second inorganic film is formed so as to completely cover the edge of the organic film.

7. The OLED display device according to claim 1, wherein the organic film has a thickness of approximately 1 μm to 20 μm.

8. The OLED display device according to claim 1, wherein the first inorganic film is formed directly above the OLEDs, the organic film including the at least one groove is formed directly above the organic film, and the second inorganic film is formed directly above the organic film, and
wherein the at least one groove has a shape selected from among a circle, an oval, a polygon, a square, and a triangle.

9. An organic light emitting diode (OLED) display device comprising:
a substrate having a display area and a non-display area;
OLEDs formed on the substrate in the display area, and including a first electrode, an organic emission layer (EML) form on the first electrode, a second electrode formed on the EML;
a bank insulating film formed at each side of the OLEDs;
a plurality of passivation films formed on the OLEDs, the plurality of passivation films including a first inorganic film formed on the OLEDs, an organic film formed on the first inorganic film, and a second inorganic film formed on the organic film; and
at least one groove formed in a region of an edge of the organic film corresponding to a plurality of wires through which a driving signal is applied to the OLEDs.

10. The OLED display device according to claim 9, wherein the at least one groove has a shape selected from among a circle and an oval.

11. The OLED display device according to claim 9, wherein the at least one groove has a shape selected from among a polygon, a square, and a triangle.

12. The OLED display device according to claim 9, wherein an edge of the bank insulating film is disposed within the at least one inside edge of the organic film.

13. The OLED display device according to claim 12, wherein an outermost portion of the at least one inside edge of the organic film in which the at least one groove is formed has a distance of approximately 1 μm to 500 μm from the edge of the bank insulating film.

14. The OLED display device according to claim 9, wherein the second inorganic film is formed so as to completely cover the at least one inside edge of the organic film.

15. The OLED display device according to claim 9, wherein the organic film has a thickness of approximately 1 μm to 20 μm.

16. The OLED display device according to claim 9, wherein the first inorganic film is formed directly above the plurality of OLEDs, the organic film including the at least one groove is formed directly above the organic film, and the second inorganic film is formed directly above the organic film, and
wherein the at least one groove has a shape selected from among a circle, an oval, a polygon, a square, and a triangle.

* * * * *